United States Patent
Choi et al.

(10) Patent No.: US 9,570,448 B2
(45) Date of Patent: Feb. 14, 2017

(54) SEMICONDUCTOR DEVICE AND METHOD FOR MANUFACTURING THE SAME

(71) Applicant: Samsung Electronics Co., Ltd., Suwon-si (KR)

(72) Inventors: Youn-Seok Choi, Seoul (KR); Young-min Ko, Hwaseong-si (KR); Honggun Kim, Hwaseong-si (KR); Jongmyeong Lee, Seongnam-si (KR); Byoungdeog Choi, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/191,552

(22) Filed: Jun. 24, 2016

(65) Prior Publication Data
US 2016/0379985 A1    Dec. 29, 2016

(30) Foreign Application Priority Data

Jun. 24, 2015 (KR) .................. 10-2015-0089889

(51) Int. Cl.
| | |
|---|---|
| *H01L 21/20* | (2006.01) |
| *H01L 27/108* | (2006.01) |
| *H01L 21/311* | (2006.01) |
| *H01L 49/02* | (2006.01) |

(52) U.S. Cl.
CPC .... *H01L 27/10855* (2013.01); *H01L 21/31111* (2013.01); *H01L 21/31116* (2013.01); *H01L 21/31133* (2013.01); *H01L 21/31138* (2013.01); *H01L 28/90* (2013.01)

(58) Field of Classification Search
CPC ..... H01L 51/05; H01L 29/92; H01L 29/66174
See application file for complete search history.

(56) References Cited

U.S. PATENT DOCUMENTS

| | | |
|---|---|---|
| 7,067,385 B2 | 6/2006 | Manning |
| 8,728,898 B2 | 5/2014 | Kim |
| 8,941,164 B2 | 1/2015 | Cho et al. |
| 2005/0054159 A1 | 3/2005 | Manning et al. |
| 2006/0073670 A1 | 4/2006 | Bae et al. |

(Continued)

FOREIGN PATENT DOCUMENTS

| | | |
|---|---|---|
| KR | 10-2010-0078971 | 7/2010 |
| KR | 10-1111922 | 6/2012 |

(Continued)

*Primary Examiner* — Elias M Ullah
(74) *Attorney, Agent, or Firm* — Muir Patent Law, PLLC

(57) ABSTRACT

A method for manufacturing a semiconductor device includes forming a storage node hole passing through an upper support layer, a bowing prevention layer and an upper mold layer using a dry etching process, forming a lower electrode in the storage node hole, patterning the upper support layer and the bowing prevention layer to expose a portion of the upper mold layer, removing the upper mold layer and at least a portion of the bowing prevention layer using a first wet etching process, and sequentially forming a dielectric layer and an upper electrode that cover the lower electrode. An etch rate of the bowing prevention layer may be substantially equal to an etch rate of the upper support layer during the dry etching process. An etch rate of the bowing prevention layer may be higher than an etch rate of the upper support layer during the first wet etching process.

20 Claims, 12 Drawing Sheets

(56) References Cited

U.S. PATENT DOCUMENTS

| | | |
|---|---|---|
| 2009/0014833 A1 | 1/2009 | Yoon et al. |
| 2013/0228837 A1 | 9/2013 | Sukekawa et al. |
| 2014/0134839 A1 | 5/2014 | Kim et al. |
| 2014/0138794 A1 | 5/2014 | Yang et al. |

FOREIGN PATENT DOCUMENTS

| | | |
|---|---|---|
| KR | 10-2014-0062602 | 5/2014 |
| KR | 10-2014-0087357 | 7/2014 |

SEMICONDUCTOR DEVICE AND METHOD FOR MANUFACTURING THE SAME

CROSS-REFERENCE TO RELATED APPLICATION

This U.S. non-provisional patent application claims priority under 35 U.S.C. §119 to Korean Patent Application No. 10-2015-0089889, filed on Jun. 24, 2015, in the Korean Intellectual Property Office, the disclosure of which is hereby incorporated by reference in its entirety.

BACKGROUND

The present disclosure relates to a semiconductor device and a method for manufacturing the same. More particularly, the present disclosure relates to a semiconductor device including a capacitor and a method for manufacturing the same.

Capacitors having a sufficient capacitance in a limited area have increased in demand as semiconductor devices have become more highly integrated. The capacitance of a capacitor is proportional to a surface area of an electrode and a dielectric constant of a dielectric layer but is inversely proportional to an equivalent thickness of the dielectric layer. Thus, to increase the capacitance of a capacitor in a limited area, a capacitor having a three-dimensional structure may be formed to increase the surface area of an electrode, the equivalent thickness of a dielectric layer may be reduced, and/or a dielectric layer having a high dielectric constant may be used in a capacitor.

SUMMARY

Embodiments of the inventive concepts may provide a semiconductor device including a capacitor with an increased capacitance and a method for manufacturing the same.

In certain embodiments, a method for manufacturing a semiconductor device includes sequentially forming an upper mold layer, a bowing prevention layer, and an upper support layer on a substrate; forming a storage node hole passing through the upper support layer, the bowing prevention layer and the upper mold layer by using a dry etching process; forming a lower electrode in the storage node hole; patterning the upper support layer and the bowing prevention layer to expose a portion of the upper mold layer; removing the upper mold layer and at least a portion of the bowing prevention layer using a first wet etching process; and sequentially forming a dielectric layer and an upper electrode that cover the lower electrode. During the dry etching process, an etch rate of the bowing prevention layer may be substantially equal to an etch rate of the upper support layer. During the first wet etching process, an etch rate of the bowing prevention layer may be higher than an etch rate of the upper support layer. The upper support layer and bowing prevention layer may each have a substantially uniform thickness, and a sum of a thickness of the upper support layer and a thickness of the bowing prevention layer may range from 15% to 25% of a depth of the storage node hole.

In certain embodiments, the thickness of the upper support layer may range from 7% to 14% of the depth of the storage node hole.

In certain embodiments, the thickness of the upper support layer may range from 70 nm to 140 nm.

In certain embodiments, the etch rate of the bowing prevention layer may range from 80% to 120% of the etch rate of the upper support layer during the dry etching process.

In certain embodiments, during the first wet etching process, the etch rate of the bowing prevention layer may range from 20 times to 500 times the etch rate of the upper support layer.

In certain embodiments, during the first wet etching process, the etch rate of the bowing prevention layer may range from 50 nm/min to 500 nm/min.

In certain embodiments, during the first wet etching process, the etch rate of the upper support layer may range from 1 nm/min to 2.5 nm/min.

In certain embodiments, during the first wet etching process, an etch rate of the upper mold layer may range from the same as to up to 20 times the etch rate of the bowing prevention layer.

In certain embodiments, the bowing prevention layer may include $Si_{(1-x)}N_x$, where $0.51<x<0.55$. The bowing prevention layer may be formed of a different material from that of the upper support layer.

In certain embodiments, the bowing prevention layer may further include oxygen (O) or phosphorus (P).

In certain embodiments, the first wet etching process may be performed using a low ammonium fluoride liquid (LAL) solution.

In certain embodiments, the lower electrode may form a capacitor that is part of a memory cell including at least one transistor formed in part by a doped region in the substrate.

In certain embodiments, the upper support layer may include silicon carbonitride (SiCN).

In certain embodiments, the method for manufacturing the semiconductor device further includes sequentially forming a lower mold layer and a lower support layer on the substrate before forming the upper mold layer; and forming the storage node hole passing through the upper support layer, the bowing prevention layer, the upper mold layer, the lower support layer, and the lower mold layer.

In certain embodiments, the method further includes patterning the lower support layer to expose a portion of the lower mold layer, and removing the lower mold layer using a second wet etching process before forming the dielectric layer. A portion of the bowing prevention layer may remain after the first wet etching process, and the remaining portion of the bowing prevention layer may be removed by the second wet etching process.

In certain embodiments, a method for manufacturing a semiconductor device includes sequentially forming an upper mold layer, a bowing prevention layer, and an upper support layer on a substrate; forming a storage node hole passing through the upper support layer, the bowing prevention layer, and the upper mold layer; forming a lower electrode in the storage node hole; patterning the upper support layer and the bowing prevention layer to expose a portion of the upper mold layer; removing the upper mold layer and at least a portion of the bowing prevention layer; and sequentially forming a dielectric layer and an upper electrode that cover the lower electrode. The bowing prevention layer may include $Si_{(1-x)}N_x$, where $0.51<x<0.55$, and the upper support layer may include silicon carbonitride (SiCN).

In certain embodiments, the upper mold layer may include silicon oxide.

In certain embodiments, forming the storage node hole includes performing a dry etching process. During the dry etching process, an etch rate of the bowing prevention layer may be substantially equal to an etch rate of the upper support layer.

In certain embodiments, removing the upper mold layer and the at least a portion of the bowing prevention layer includes performing a wet etching process. During the wet etching process, an etch rate of the bowing prevention layer may range from 20 times to 500 times an etch rate of the upper support layer.

In certain embodiments, during the wet etching process, an etch rate of the upper mold layer may range from the same as to up to 20 times the etch rate of the bowing prevention layer.

In certain embodiments, a sum of a thickness of the upper support layer and a thickness of the bowing prevention layer may range from 15% to 25% of a depth of the storage node hole.

In certain embodiments, wherein the lower electrode forms a capacitor that is part of a memory cell including at least one transistor formed in part by a doped region in the substrate.

According to certain embodiments, a method for manufacturing a semiconductor device includes: providing a semiconductor substrate, the semiconductor substrate including doped regions for forming transistors; forming a first insulating layer on the semiconductor substrate; forming a plurality of contact plugs extending vertically from a top surface of the first insulating layer to respective doped regions on the semiconductor substrate; sequentially forming a first mold layer, a first support layer, a second mold layer, a second support supplemental layer, and a second support layer on the first insulating layer; forming a plurality of storage node holes passing through the second support layer, the second support supplemental layer, the second mold layer, the first support layer, and the first mold layer using a dry etching process; forming a plurality of lower electrodes in corresponding each of the plurality of storage node holes; removing the second mold layer and at least portion of the second support supplemental layer using a first wet etching process; removing the first mold layer using a second wet etching process; and sequentially forming a dielectric layer and an upper electrode that cover the plurality of lower electrodes. Each of the plurality of storage node holes may be formed over the first insulating layer and a corresponding contact plug of the plurality of contact plugs.

In certain embodiments, during the first wet etching process, a first etch rate of the second support supplemental layer ranges from 50 nm/min to 500 nm/min during the first wet etching process, and a first etch rate of the second support layer ranges from 1 nm/min to 2.5 nm/min.

In certain embodiments, an etch rate of the second support supplemental layer is substantially equal to an etch rate of the second support layer, and an etch rate of the second support supplemental layer is lower than an etch rate of the first mold layer and lower than an etch rate of the second mold layer during the dry etching process.

In certain embodiments, the second support supplemental layer is a deformation prevention layer that includes $Si(1-x)N_x$, where $0.51<x<0.55$, and the second support layer includes silicon carbonitride (SiCN).

BRIEF DESCRIPTION OF THE DRAWINGS

The inventive concepts will become more apparent in view of the attached drawings and accompanying detailed description.

DETAILED DESCRIPTION

Figure 1A:
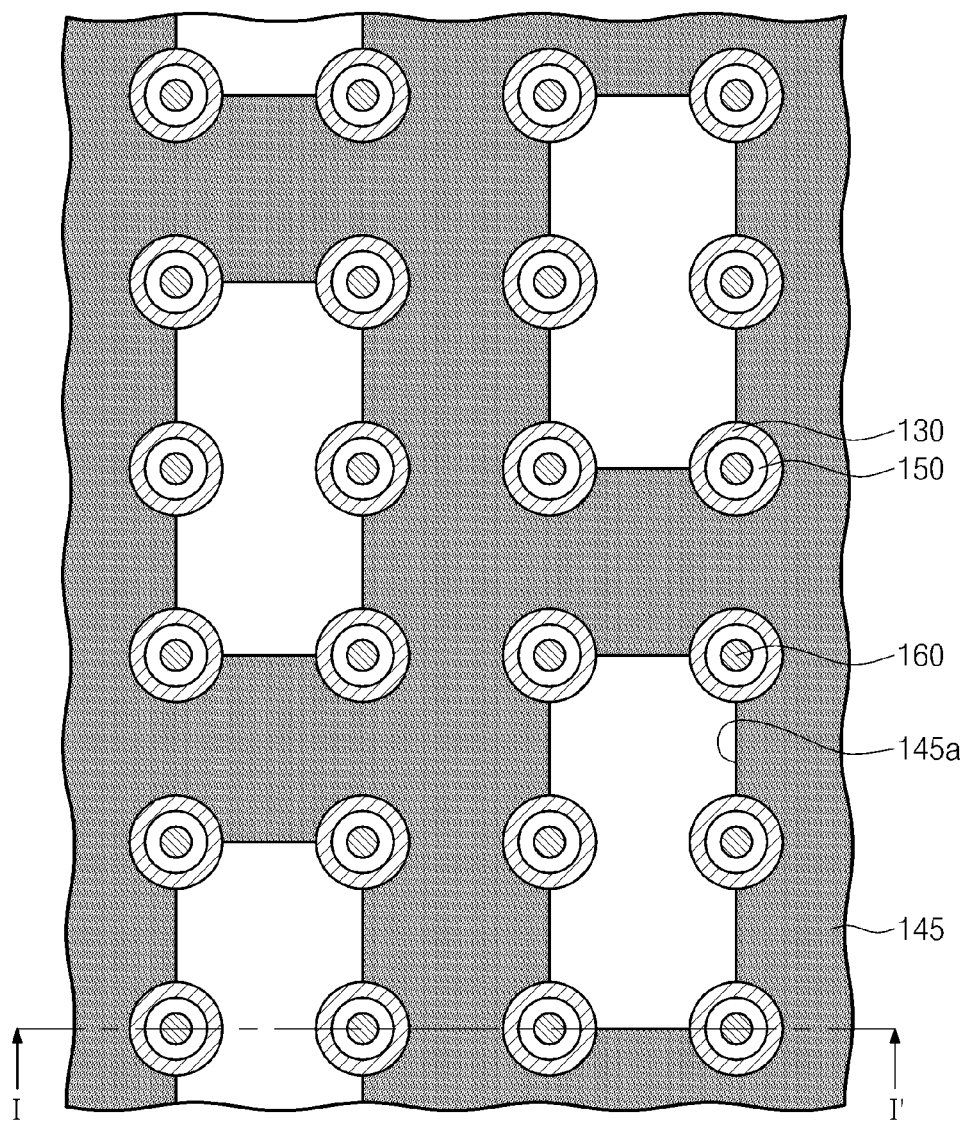
FIG. 1A is a plan view illustrating a semiconductor device according to example embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same or similar elements throughout the specification.

Unless defined otherwise, all technical and scientific terms used herein have the same meaning as commonly understood by one of ordinary skill in the art.

As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising", "having," "containing," "includes" and/or "including", when used herein, are to be construed as open-ended terms and specify the presence of stated features, integers, steps, operations, elements, and/or components, but do not preclude the presence or addition of one or more other features, integers, steps, operations, elements, components, and/or groups thereof.

Spatially relative terms, such as "top," "bottom," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Additionally, exemplary embodiments are described herein with reference to cross-sectional views and/or plan views that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle may have rounded or curved features. Thus, the regions illustrated in the figures are schematic in nature and their shapes are not intended to limit the scope of the embodiments. Additionally, the dimensions of layers and regions shown in the figures may be exaggerated for clarity of illustration.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. Terms such as "exactly" or "identical" may be used to indicate no such variation.

Figure 1B:
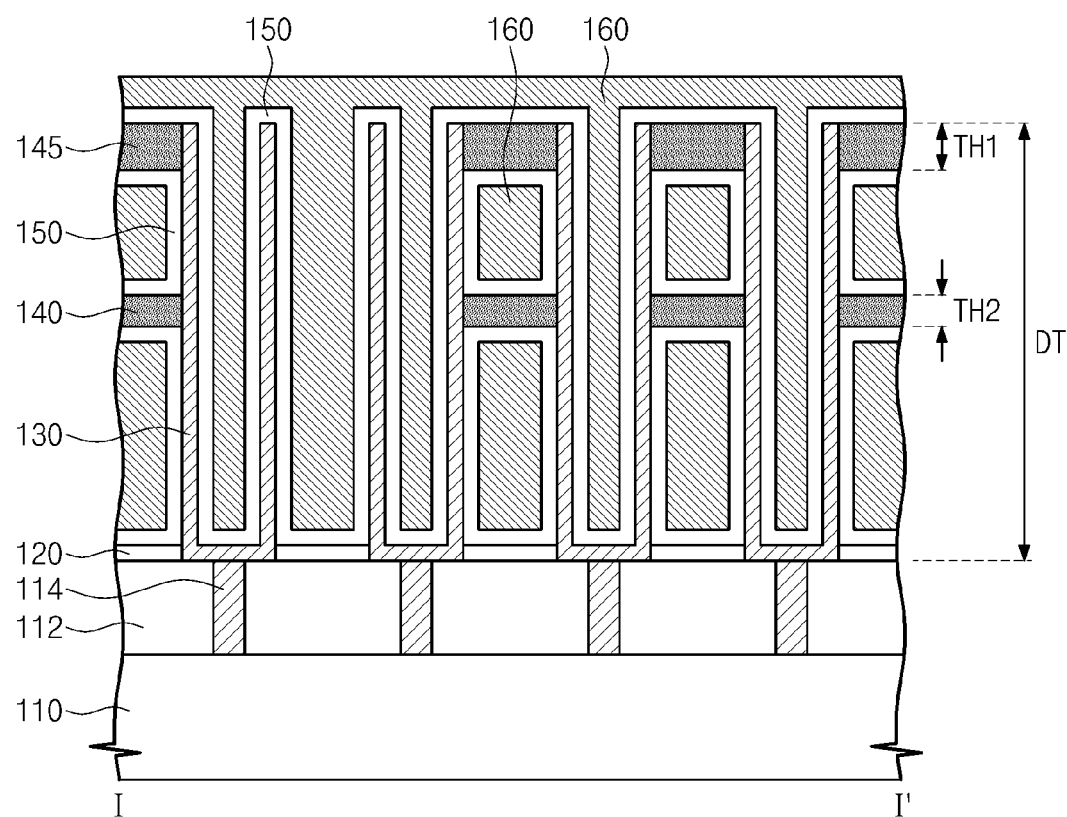
FIG. 1B is a cross-sectional view taken along a line I-I' of FIG. 1A.

FIG. 1A is a plan view illustrating a semiconductor device according to example embodiments of the inventive concepts. FIG. 1B is a cross-sectional view taken along a line I-I' of FIG. 1A.

Referring to FIGS. 1A and 1B, a semiconductor device 100 may include a substrate 110, a lower insulating layer 112, contact plugs 114, an etch stop layer 120, lower electrodes 130, a lower support pattern 140, an upper support pattern 145, a dielectric layer 150, and an upper electrode 160. The lower electrodes 130, the dielectric layer 150, and the upper electrode 160 may constitute a plurality of capacitors. Capacitance of each of the capacitors formed by a lower electrode 130 and the upper electrode 160 may be proportional to an area of the dielectric layer 150 disposed between the upper electrode 160 and the particular lower electrode 130.

The substrate 110 may be a semiconductor substrate such as, for example, a silicon (Si) substrate, a germanium (Ge) substrate, or silicon-germanium (SiGe) substrate. The substrate 110 may be formed from a wafer. Even though not shown in the drawings, word lines (not shown) may be disposed on the substrate 110, and doped regions may be disposed in the substrate 110 at both (e.g., opposite) sides of each of the word lines.

The lower insulating layer 112 may be disposed on the substrate 110. The lower insulating layer 112 may include an insulating material. For example, the lower insulating layer 112 may include at least one of silicon oxide, silicon nitride, or silicon oxynitride.

Each of the contact plugs 114 may penetrate (e.g., may pass through a hole or opening in) the lower insulating layer 112. Each of the contact plugs 114 may be electrically connected to one of the doped regions (not shown) formed in the substrate 110. The contact plugs 114 may include a conductive material. For example, the contact plugs 114 may include at least one of a semiconductor material doped with dopants (e.g., doped poly-crystalline silicon), a metal-semiconductor compound (e.g., a metal silicide such as titanium silicide or tungsten silicide), a conductive metal nitride (e.g., titanium nitride, tantalum nitride or tungsten nitride), or a metal (e.g., titanium, tantalum, or tungsten). The contact plugs 114 may also be described as through vias, which pass through lower insulating layer 112.

The etch stop layer 120 may be disposed on the lower insulating layer 112. The etch stop layer 120 may include, for example, silicon nitride or silicon oxynitride. In some embodiments, the etch stop layer 120 may be omitted.

The lower electrodes 130 may be disposed on the lower insulating layer 112. Each of the lower electrodes 130 may penetrate the etch stop layer 120 so as to be electrically connected to corresponding one of the contact plugs 114. For example, each lower electrode 130 may pass through the etch stop layer 120 to electrically connect to a corresponding contact plug 114 (e.g., by contacting the contact plug). In some embodiments, the lower electrodes 130 may be arranged in a row direction and a column direction when viewed from a plan view, as illustrated in FIG. 1A. However, the inventive concepts are not limited thereto. Alternatively, the lower electrodes 130 may be arranged in a zigzag form when viewed from a plan view (e.g., when viewed with respect to adjacent edges of the array of lower electrodes 130).

Each of the lower electrodes 130 may extend in a direction perpendicular to a top surface of the substrate 110. In some embodiments, each of the lower electrodes 130 may have a hollow cylindrical shape of which a bottom end is closed, as illustrated in FIGS. 1A and 1B. However, the inventive concepts are not limited thereto. Each of the lower electrodes 130 may have one of other various shapes (e.g., a pillar shape). In the drawings according to example embodiments of the inventive concepts, the lower electrodes 130 having hollow cylindrical shapes are illustrated as examples.

In the case where the lower electrodes 130 have hollow cylindrical shapes, each of the lower electrodes 130 may include a flat plate portion extending in parallel to the top surface of the substrate 110 and a wall portion extending upward from an edge of the flat plate portion. Each of the lower electrodes 130 may be electrically connected to a corresponding one of the contact plugs 114. For example, a bottom surface of the flat plate portion of each of the lower electrodes 130 may be in contact with a top surface of a corresponding one of the contact plugs 114.

The lower electrodes 130 may include a conductive material. For example, the lower electrodes 130 may include at least one of a semiconductor material doped with dopants (e.g., doped poly-crystalline silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide).

In the semiconductor device according to example embodiments of the inventive concepts, the capacitance of each capacitor is proportional to a surface area of a corresponding one of the lower electrodes 130. Thus, a height DT of each lower electrode 130 may be increased to increase the surface area of the lower electrode 130 formed in a limited area. As a result, an aspect ratio of the lower electrode 130 (i.e., a ratio of a height of the lower electrode to a width of the lower electrode) may be increased as the capacitance of the capacitor is increased. For example, the height DT of the lower electrodes 130 may range from about 700 nm to about 1300 nm (e.g., 700 nm, 1300 nm, or some height therebetween, or in some cases, slightly less than 700 nm or slightly more than 1300 nm. Different heights or thicknesses described herein as ranging from a first value to a second value, unless the context indicates otherwise, should be understood as having a single value (e.g., a substantially same thickness or height throughout), which value can be selected from the given range.

The lower support pattern 140 and the upper support pattern 145 may be disposed on the etch stop layer 120. The upper support pattern 145 may be disposed to be adjacent to upper portions of the lower electrodes 130 extending in the direction perpendicular to the top surface of the substrate 110, and the lower support pattern 140 may be disposed between the upper support pattern 145 and the etch stop layer 120. The lower and upper support patterns 140 and 145 may be in contact with portions of sidewalls of the lower electrodes 130. Thus, the lower and upper support patterns 140 and 145 may horizontally support the lower electrodes 130 to prevent the lower electrodes 130 from bending or leaning. Two support patterns 140 and 145 are illustrated in FIG. 1B. However, the inventive concepts are not limited thereto. In an exemplary embodiment, at least one additional support pattern (not shown) may be provided on the etch stop layer 120. In an exemplary embodiment, the lower support pattern 140 may be omitted. Further, though the upper support pattern 145 is shown at an upper portion of the lower electrodes 130 and as having a top surface coplanar with the top surfaces of the lower electrodes 130, in some embodiments, the upper support pattern 145 may be at an upper portion of the lower electrodes 130 such that the top surface of the upper support pattern 145 is lower than the top surfaces of the lower electrodes 130. In either case, the upper support pattern 145 may be at an upper portion (e.g., an upper 1/3) of the lower electrodes 130.

The upper support pattern 145 may have first openings 145a in predetermined regions. Each of the first openings 145a may have, for example, a rectangular shape, a bar shape, or a linear shape. However, the inventive concepts are not limited thereto. In some embodiments, the shapes of the first openings 145a may be variously modified. The first openings 145a having rectangular shapes are illustrated as an example in FIG. 1A.

The lower support pattern 140 may have second openings (not shown) in predetermined regions. Like the first openings 145a, the second openings (not shown) may have, for example, a rectangular shape, a bar shape, or a linear shape. However, the inventive concepts are not limited thereto. In some embodiments, the shapes of the second openings may be variously modified. The second openings may overlap with the first openings 145a when viewed from a plan view.

As thicknesses of the lower and upper support patterns 140 and 145 increase, supporting strength of the lower and upper support patterns 140 and 145 with respect to the lower electrodes 130 may increase. However, as the thicknesses of the lower and upper support patterns 140 and 145 increase, the area of the dielectric layer 150 disposed between the upper electrode 160 and the lower electrodes 130 may be reduced. As a result, the capacitance of the capacitors may decrease. Thus, the thicknesses of the lower and upper support patterns 140 and 145 may be determined by considering at least two factors—the supporting strength and the capacitance. In some embodiments, the thickness TH1 of the upper support pattern 145 may range from about 70 nm to about 140 nm (e.g., 70 nm, 140 nm, or some thickness therebetween, or in some cases slightly less than 70 nm or slightly more than 140 nm), and the thickness TH2 of the lower support pattern 140 may be equal to or smaller than the thickness TH1 of the upper support pattern 145. In some embodiments, the thickness TH1 of the upper support pattern 145 may range from about 7% to about 14% (e.g., 7%, 14%, or some percentage therebetween, or in some cases slightly less than 7% or slightly more than 14%) of the height DT of each of the lower electrodes 130, and the thickness TH2 of the lower support pattern 140 may be equal to or smaller than 7% of the height DT of each of the lower electrodes 130. The lower support pattern 140 and the upper support pattern 145 may include, for example, silicon carbonitride (SiCN).

The dielectric layer 150 formed on the surfaces of the lower electrodes 130 may have substantially uniform thickness on the surfaces of the lower electrodes 130. For example, the dielectric layer 150 may have a thickness of about 5 nm to about 15 nm (e.g., 5 nm, 15 nm, or some thickness therebetween, or in some cases slightly less than 5 nm or slightly more than 15 nm). The dielectric layer 150 may extend onto surfaces of the lower and upper support patterns 140 and 145 and a top surface of the etch stop layer 120. The dielectric layer 150 may be a single-layer or multi-layer including at least one selected from a group consisting of metal oxides (e.g., $HfO_2$, $ZrO_2$, $Al_2O_3$, $La_2O_3$, $Ta_2O_3$, and $TiO_2$) and perovskite-structural dielectric materials (e.g., $SrTiO_3$(STO), $(Ba,Sr)TiO_3$(BST), $BaTiO_3$, PZT, and PLZT).

The upper electrode 160 may be disposed on the dielectric layer 150 to cover the lower electrodes 130. As illustrated in FIGS. 1A and 1B, when each of the lower electrodes 130 has a hollow cylindrical shape, the upper electrode 160 may fill an inner region of each corresponding hollow cylindrical shape. Thus, the dielectric layer 150 may be disposed between the upper electrode 160 and inner and outer sidewalls of each of the corresponding lower electrodes 130. The upper electrode 160 may include a conductive material. For example, the upper electrode 160 may include at least one of a semiconductor material doped with dopants (e.g., doped poly-crystalline silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide).

FIGS. 2 to 9 are cross-sectional views corresponding to the line I-I' of FIG. 1A to illustrate a method for manufacturing a semiconductor device according to example embodiments of the inventive concepts. Hereinafter, the substantially same elements as described with reference to FIGS. 1A and 1B will be indicated by the same reference numerals or the same reference designators, and the descriptions thereto will be omitted or mentioned briefly for the purpose of ease and convenience in explanation.

Figure 2:
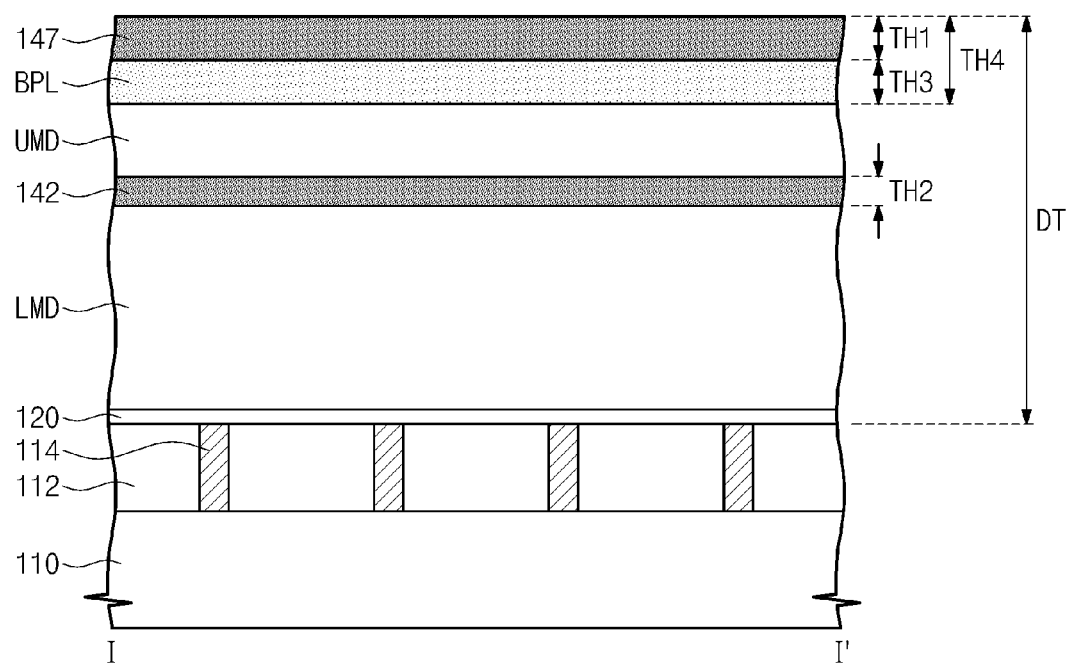
FIGS. 2 to 9 are cross-sectional views corresponding to the line I-I' of FIG. 1A to illustrate a method for manufacturing a semiconductor device according to example embodiments of the inventive concepts.

Referring to FIG. 2, a lower insulating layer 112 may be formed on a substrate 110. The substrate 110 may be a semiconductor substrate such as a silicon (Si) substrate, a germanium (Ge) substrate, or silicon-germanium (SiGe) substrate, for example formed from a wafer. The lower insulating layer 112 may include, for example, at least one of silicon oxide, silicon nitride, or silicon oxynitride. Even though not shown in the drawings, word lines (not shown) may be formed on the substrate 110, and doped regions may be formed in the substrate 110 at both (e.g., opposite) sides of each of the word lines.

Contact plugs 114 may be formed to penetrate the lower insulating layer 112. Forming the contact plugs 114 may include forming contact holes penetrating the lower insulating layer 112, forming a conductive layer (not shown) filling the contact holes, and planarizing the conductive layer (not shown) until a top surface of the lower insulating layer 112 is exposed. The contact plugs may pass through the entire insulating layer 112. The contact plugs 114 may include a conductive material. For example, the contact plugs 114 may include at least one of a semiconductor material doped with dopants (e.g., doped poly-crystalline silicon), a metal-semiconductor compound (e.g., a metal silicide such as titanium silicide or tungsten silicide), a conductive metal nitride (e.g., titanium nitride, tantalum nitride, or tungsten nitride), or a metal (e.g., titanium, tantalum, or tungsten).

An etch stop layer 120, a lower mold layer LIVID, a lower support layer 142, an upper mold layer UMD, a bowing prevention layer BPL, and an upper support layer 147 may be sequentially formed on the lower insulating layer 112. Each of the layers 120, LMD, 142, UMD, BPL, and 147 may be formed, for example, by a chemical vapor deposition (CVD) process or a physical vapor deposition (PVD) process.

The etch stop layer 120 may include a material that has an etch selectivity with respect to the lower mold layer LMD during a wet etching process. For example, the etch stop layer 120 may include silicon nitride or silicon oxynitride. In one embodiment, the lower mold layer LIVID and the upper mold layer UMD may include silicon oxide. The lower support layer 142 and the upper support layer 147 may include silicon carbonitride (SiCN). In certain embodiments, the bowing prevention layer BPL may include $Si_{(1-x)}N_x$ where $0.51<x<0.55$. According to some embodiments, forming the bowing prevention layer BPL may further include doping the bowing prevention layer BPL with oxygen (O) or phosphorus (P). Thus, the bowing prevention layer BPL may include $Si_{(1-x)}N_x$ doped with oxygen (O) or $Si_{(1-x)}N_x$ doped with phosphorus (P). The bowing prevention layer BPL may also be referred to herein as an upper support supplemental layer, as it may be adjacent to the upper support layer 147 and formed by a different material and/or by a different process.

A sum TH4 of a thickness TH1 of the upper support layer 147 and a thickness TH3 of the bowing prevention layer BPL may range from about 15% to about 25% of a total thickness DT of the layers 120, LIVID, 142, UMD, BPL, and 147 (e.g., 15%, 25%, or some percentage therebetween, or in some cases slightly less than 15% or slightly more than 25%). The thickness TH1 of the upper support layer 147 may range from about 7% to about 14% of the total thickness DT of the layers 120, LMD, 142, UMD, BPL, and 147 (e.g., 7%, 14%, or some percentage therebetween, or in some cases slightly less than 7% or slightly more than 14%). Regardless of the particular percentage thickness, the upper support layer 147 may have a substantially uniform thickness (e.g., subject to slight manufacturing variations) and the bowing prevention layer BPL may have a substantially uniform thickness (e.g., subject to slight manufacturing variations).

In some embodiments, the sum TH4 of the thickness TH1 of the upper support layer 147 and the thickness TH3 of the bowing prevention layer BPL may range from about 150 nm to about 250 nm (e.g., 150 nm, 250 nm, or some thickness therebetween, or in some cases slightly less than 150 nm or slightly more than 250 nm), and the thickness TH1 of the upper support layer 147 may range from about 70 nm to about 140 nm (e.g., 70 nm, 140 nm, or some thickness therebetween, or in some cases slightly less than 70 nm or slightly more than 140 nm). A thickness TH2 of the lower support layer 142 may be less than or equal to the thickness TH1 of the upper support layer 147. The total thickness DT of the layers 120, LIVID, 142, UMD, BPL, and 147 may range from about 700 nm to about 1300 nm (e.g., 170 nm, 1300 nm, or some thickness therebetween, or in some cases slightly less than 170 nm or slightly more than 1300 nm). Each of the aforementioned layers or combinations of layers may have a substantially uniform thickness throughout.

Figure 3:
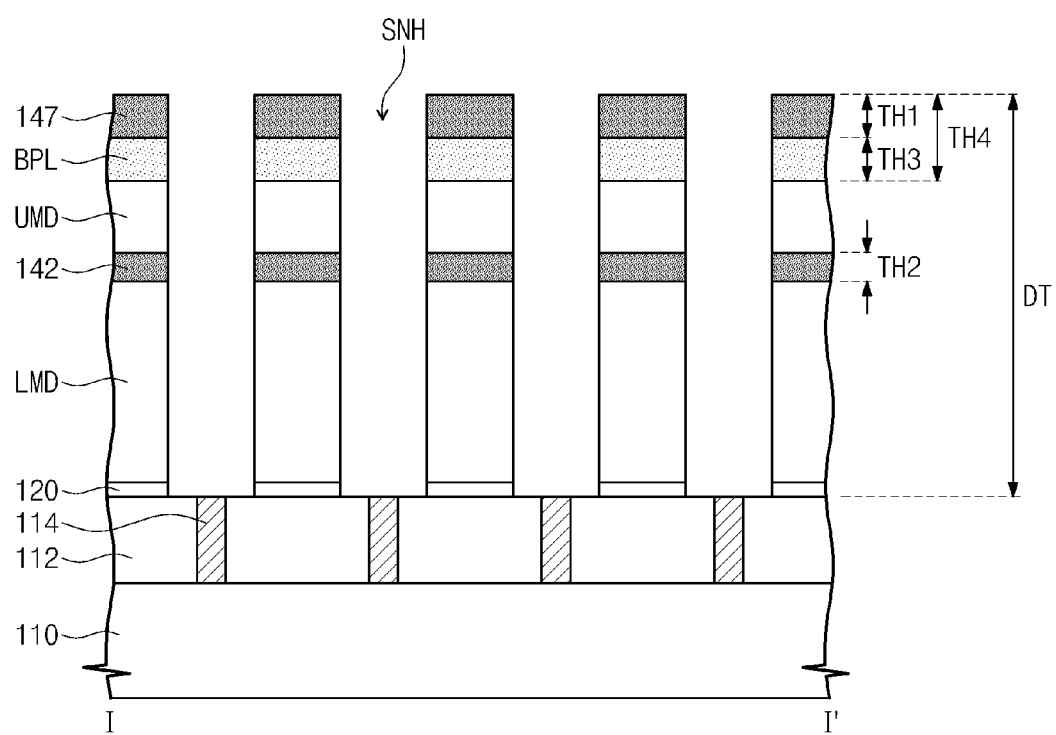

Referring to FIG. 3, storage node holes SNH may be formed to penetrate (e.g., pass through) the upper support layer 147, the bowing prevention layer BPL, the upper mold layer UMD, the lower support layer 142, the lower mold layer LMD, and the etch stop layer 120. Forming the storage node holes SNH may be performed, for example, using a dry etching process. The contact plugs 114 may be exposed by the corresponding storage node holes SNH. A depth of each of the storage node holes SNH may be equal to the total thickness DT of the layers 120, LIVID, 142, UMD, BPL, and 147 and may range, for example, from about 700 nm to about 1300 nm.

In some embodiments, for example, the lower and upper support layers 142 and 147 may include SiCN, the bowing prevention layer BPL may include $Si_{(1-x)}N_x$ (where $0.51<x<0.55$), and the lower and upper mold layers LIVID and UMD may include silicon oxide. In such embodiments, during the dry etching process, an etch rate of the bowing prevention layer BPL may be substantially equal to an etch rate of the lower and upper support layers 142 and 147. For example, during the dry etching process, the etch rate of the bowing prevention layer BPL may range from about 80% to about 120% of the etch rate of the lower and upper support layers 142 and 147 (e.g., 80%, 120%, or some percentage therebetween, or in some cases slightly less than 80% or slightly more than 120%). On the contrary, during the dry etching process, an etch rate of the lower and upper mold layers LMD and UMD may be higher than those of the bowing prevention layer BPL and the lower and upper support layers 142 and 147. The etch rates described herein may be referred to using "first," "second," etc., as a naming convention. Unless the context indicates otherwise, these modifiers do not convey an order of etching. Further, etch rates or etch rate ratios described herein as falling within a range, in certain embodiments are set to be substantially constant throughout a particular manufacturing step, and are set to be at a particular rate or ratio within the listed range during that manufacturing step.

According to a method of manufacturing a conventional semiconductor device not including the bowing prevention layer BPL, storage node holes SNH may be formed using a dry etching process which has a higher etch rate for lower and upper mold layers including silicon oxide than the etch rate for lower and upper support layers including SiCN. Thus, when the dry etching process is lengthened, a bowing phenomenon may occur. The bowing phenomenon may result in a portion of a sidewall of the upper mold layer being dented, or is bent. For example, along a vertical wall created by the dry etching process, walls of the upper mold layer may be etched more than walls of the adjacent lower and upper support layers, for example to form a concavely formed, curved surface. In particular, when the storage node hole has a deep depth ranging from about 700 nm to about 1300 nm, the dry etching process may be lengthened. As a result, an occurrence probability of the bowing phenomenon may increase, for example due to the upper mold layer being exposed by the dry etching process for a long time. A thickness of the upper support layer having a low etch rate during the dry etching process could be increased to a predetermined thickness ranging, for example, from about 150 nm to about 250 nm or from about 15% to about 25% of the depth of the storage node hole, thereby inhibiting the bowing phenomenon. However, this would increase the contact area between the upper support layer and the lower electrode, thereby reducing the capacitance of the capacitor.

In a method for manufacturing the semiconductor device in accordance with embodiments of the inventive concepts, the bowing prevention layer BPL may be formed between the upper support layer 147 and the upper mold layer UMD. Since the etch rate of the bowing prevention layer BPL is substantially equal to that of the upper support layer 147 during the dry etching process (i.e., the etch rate of the bowing prevention layer BPL is lower than that of the upper mold layer UMD), the bowing prevention layer BPL and the upper support layer 147 may prevent or reduce the bowing phenomenon from occurring during the dry etching process. In some embodiments, the sum TH4 of the thicknesses TH1 and TH3 of the upper support layer 147 and the bowing prevention layer BPL may be sufficiently increased to inhibit the bowing phenomenon. For example, the sum TH4 may range from about 150 nm to about 250 nm (e.g., 150 nm, 250 nm, or some thickness therebetween, or in some cases slightly less than 150 nm or slightly more than 250 nm) or from about 15% to about 25% (e.g., 15%, 25%, or some percentage therebetween, or in some cases slightly less than 15% or slightly more than 25%) of the depth DT of the storage node hole SNH.

In addition, in the method for manufacturing the semiconductor device in accordance with embodiments of the inventive concepts, the bowing prevention layer BPL may be removed during a subsequent wet etching process of removing the lower and upper mold layers LMD and UMD. Thus, the capacitance of the capacitor may be increased by a predetermined value corresponding to the thickness TH3 of the bowing prevention layer BPL.

Figure 4:
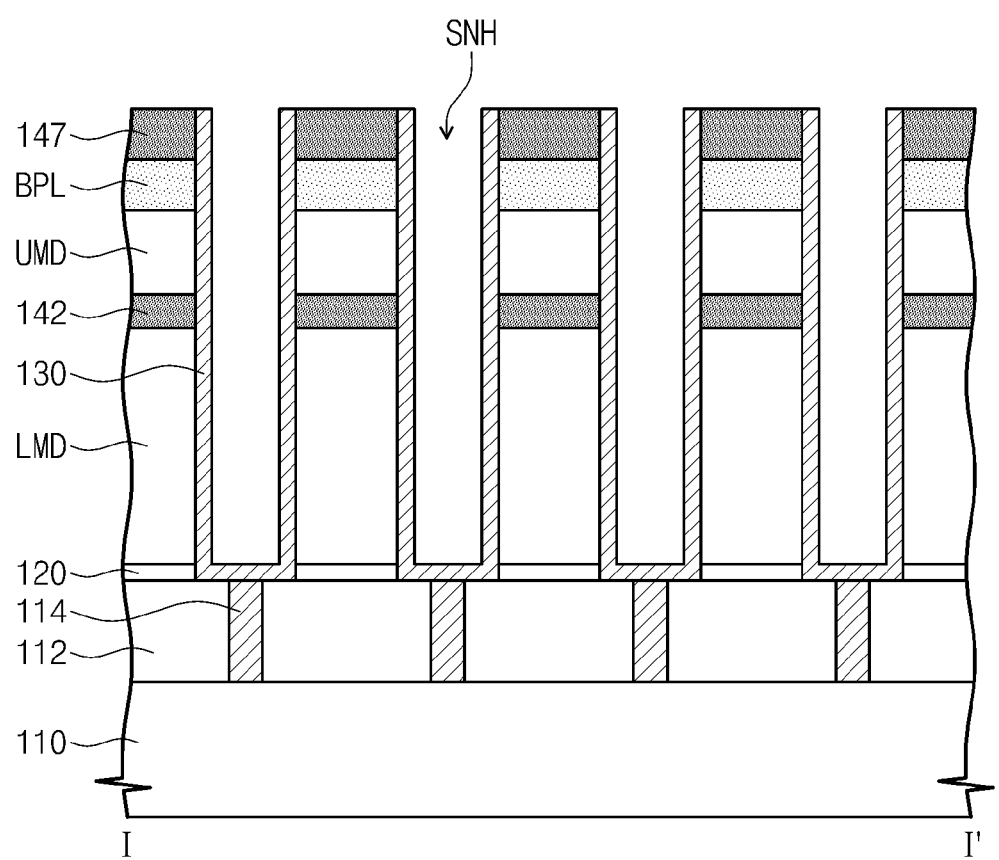

Referring to FIG. 4, lower electrodes 130 may be formed in the storage node holes SNH, respectively. Forming the lower electrodes 130 may include depositing a lower electrode layer (not shown) covering inner surfaces of the corresponding storage node holes SNH, and planarizing the lower electrode layer until a top surface of the upper support layer 147 is exposed. The lower electrode layer (not shown) may be formed, for example, using a PVD process or a CVD process. The planarization process may be performed using a chemical-mechanical polishing (CMP) process.

The lower electrodes 130 may include a conductive material. For example, the lower electrodes 130 may include at least one of a semiconductor material doped with dopants (e.g., doped poly-crystalline silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide). The lower electrodes 130 may be electrically connected to the contact plugs 114, respectively.

Figure 5:
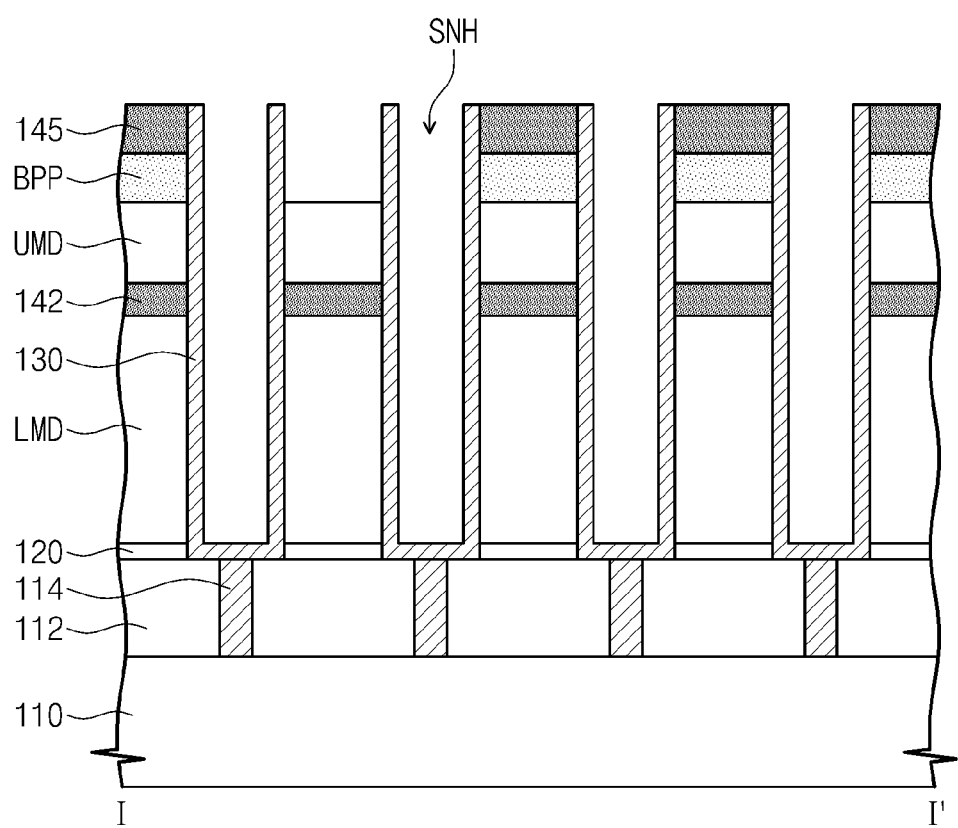

Referring to FIG. 5, the upper support layer 147 and the bowing prevention layer BPL may be patterned to form an upper support pattern 145 and a bowing prevention pattern BPP (also referred to as an upper support supplemental pattern). As illustrated in FIG. 1A, the upper support pattern 145 may have the openings 145a. Even though not shown in the drawings, the bowing prevention pattern BPP may have openings (not shown). The openings of the bowing prevention pattern BPP may overlap with, and may correspond to, openings 145a of the upper support pattern 145 when viewed from a plan view. Portions of the upper mold layer UMD may be exposed through the openings 145a of the upper support pattern 145 and the openings of the bowing prevention pattern BPP. Patterning the upper support layer 147 and the bowing prevention layer BPL may be performed using a dry etching process.

Figure 6:
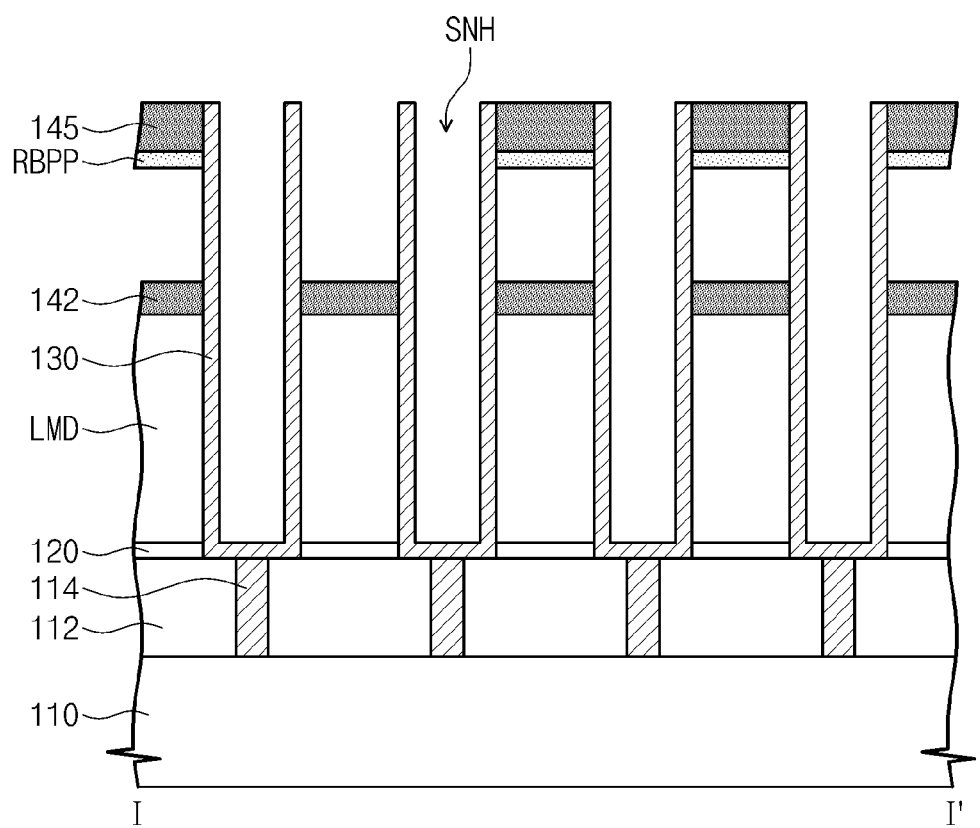

Referring to FIG. 6, the upper mold layer UMD may be removed using a wet etching process. The wet etching process may be performed, for example, using a low ammonium fluoride liquid (LAL) solution including hydrofluoric acid (HF) and $NH_4F$.

In one embodiment, in a case where the upper support pattern 145 includes SiCN, the bowing prevention pattern BPP includes $Si_{(1-x)}N_x$ (where $0.51<x<0.55$), and the upper mold layer UMD includes silicon oxide, an etch rate of the bowing prevention pattern BPP may be higher than that of the upper support pattern 145 during the wet etching process. In addition, during the wet etching process, an etch rate of the upper mold layer UMD may be equal to or higher than that of the bowing prevention pattern BPP.

In some embodiments, during the wet etching process, the etch rate of the bowing prevention pattern BPP may range from about 20 times to about 500 times (e.g., 20 times, 500 times, or some amount therebetween, or in some cases slightly less than 20 times or slightly more than 500 times) the etch rate of the upper support pattern 145 and the etch rate of the upper mold layer UMD may range from 1 time to 20 times (e.g., 1 time, 20 times, or some amount therebetween, or in some cases slightly less than 1 time or slightly more than 20 times) the etch rate of the bowing prevention pattern BPP.

In some embodiments, during the wet etching process, the etch rate of the upper support pattern 145 may range from about 1 nm/min to about 2.5 nm/min (e.g., 1 nm/min, 2.5 nm/min, or some rate therebetween, or in some cases slightly less than 1 nm/min or slightly more than 2.5 nm/min), the etch rate of the bowing prevention pattern BPP may range from about 50 nm/min to about 500 nm/min (e.g., 50 nm/min, 500 nm/min, or some rate therebetween, or in some cases slightly less than 50 nm/min or slightly more than 500 nm/min), and the etch rate of the upper mold layer UMD may range from about 500 nm/min to about 1000 nm/min (e.g., 500 nm/min, 1000 nm/min, or some rate therebetween, or in some cases slightly less than 500 nm/min or slightly more than 1000 nm/min). Thus, in some embodiments, the etch rate of the upper support pattern 145 may be smaller than the etch rate of the bowing prevention pattern BPP, which may be smaller than the etch rate of the upper mold layer UMD.

At least a portion of the bowing prevention pattern BPP may also be removed by the wet etching process. According to an embodiment, a portion of the bowing prevention pattern BPP may be removed to form a residual bowing prevention pattern RBPP, as illustrated in FIG. 6. According to another embodiment, the bowing prevention pattern BPP may be completely removed, unlike FIG. 6.

Figure 7:
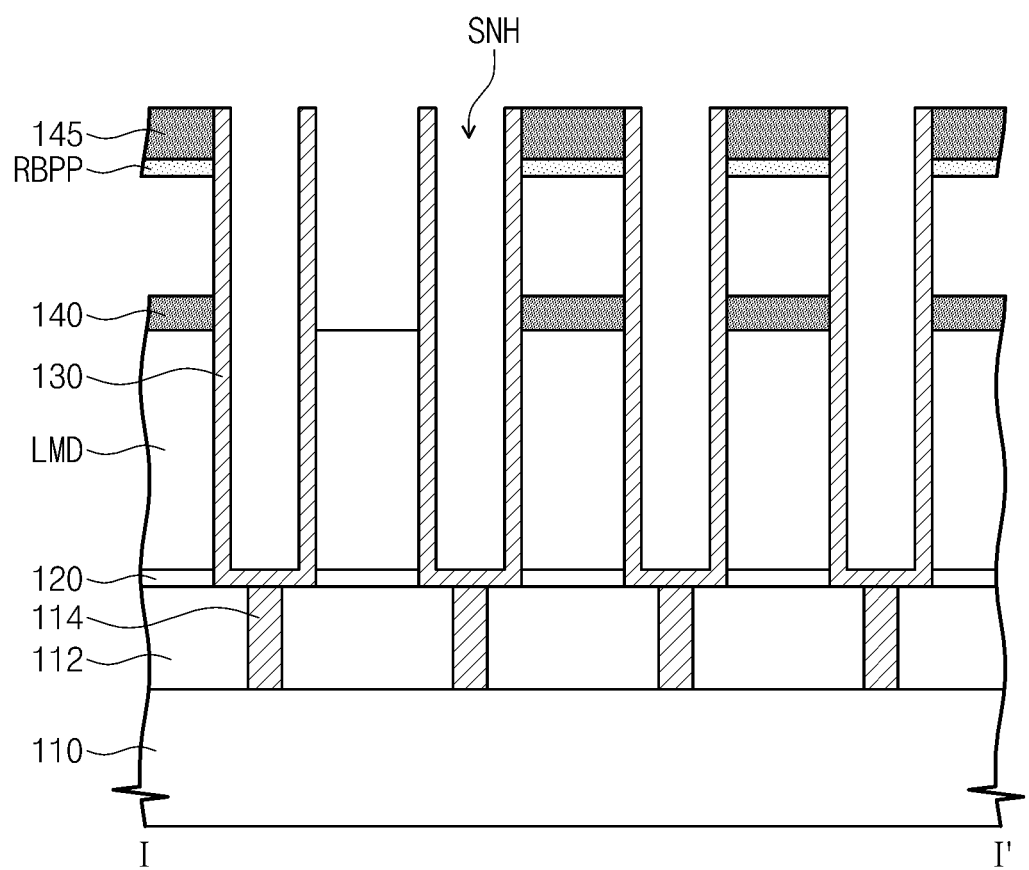

Referring to FIG. 7, the lower support layer 142 may be patterned to form a lower support pattern 140. The lower support pattern 140 may have openings that may overlap with the openings 145a (FIG. 1A) of the upper support pattern 145. Portions of the lower mold layer LIVID may be exposed by the openings of the lower support pattern 140. Patterning the lower support layer 142 may be performed using a dry etching process.

Figure 8:
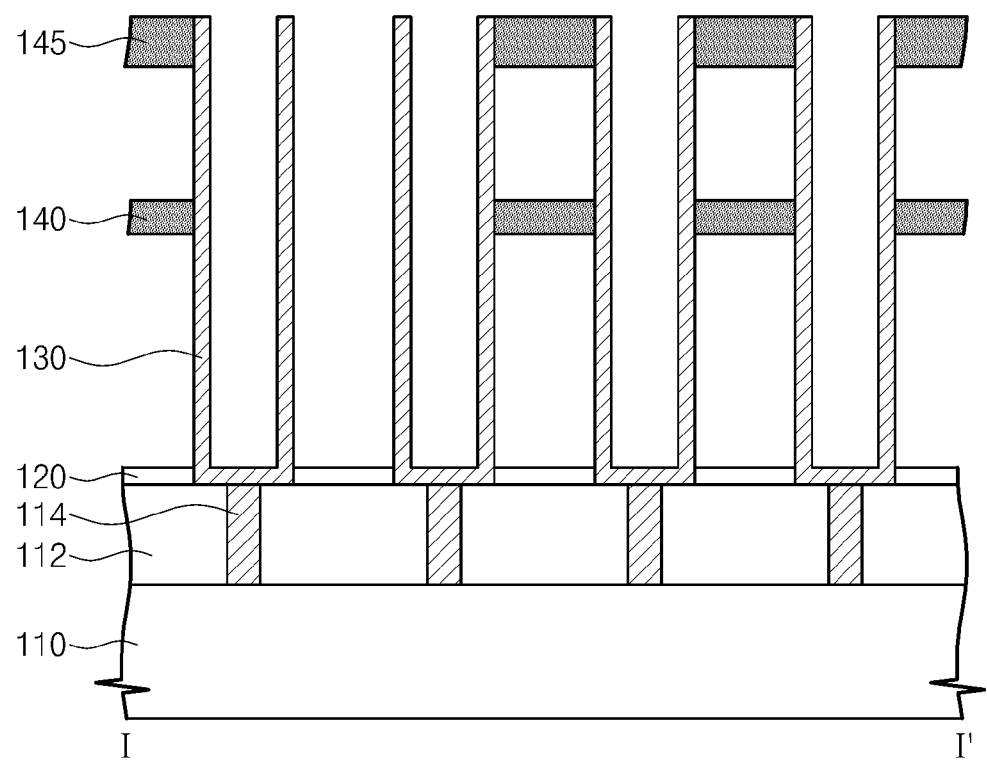

Referring to FIG. 8, the lower mold layer LIVID may be removed using a wet etching process. The wet etching process used to remove the lower mold layer LIVID may be performed using, for example, a LAL solution including HF and $NH_4F$. In some embodiments that the residual bowing prevention pattern RBPP exists as illustrated in FIGS. 6 and 7, at least a portion of the residual bowing prevention pattern RBPP may be removed by the wet etching process for removing the lower mold layer LIVID.

In the case that the lower and upper support patterns 140 and 145 include SiCN, the residual bowing prevention pattern RBPP includes $Si_{(1-x)}N_x$ (where $0.51<x<0.55$), and the lower mold layer LIVID includes silicon oxide, an etch rate of the residual bowing prevention pattern RBPP may be higher than that of the lower and upper support patterns 140 and 145 during the wet etching process of removing the lower mold layer LMD. In addition, during the wet etching process of removing the lower mold layer LIVID, an etch rate of the lower mold layer LMD may be equal to or higher than that of the residual bowing prevention pattern RBPP.

In some embodiments, during the wet etching process of removing the lower mold layer LIVID, the etch rate of the residual bowing prevention pattern RBPP may range from about 20 times to about 500 times the etch rate of the lower and upper support patterns 140 and 145, and the etch rate of the lower mold layer LMD may range from about 1 time to about 20 times the etch rate of the residual bowing prevention pattern RBPP.

In some embodiments, during the wet etching process of removing the lower mold layer LIVID, the etch rate of the lower and upper support patterns 140 and 145 may range from about 1 nm/min to about 2.5 nm/min, the etch rate of the residual bowing prevention pattern RBPP may range from about 50 nm/min to about 500 nm/min, and the etch rate of the lower mold layer LMD may range from about 500 nm/min to about 1000 nm/min.

The lower electrodes 130 may be exposed by the processes described with reference to FIGS. 5 to 8.

Figure 9:
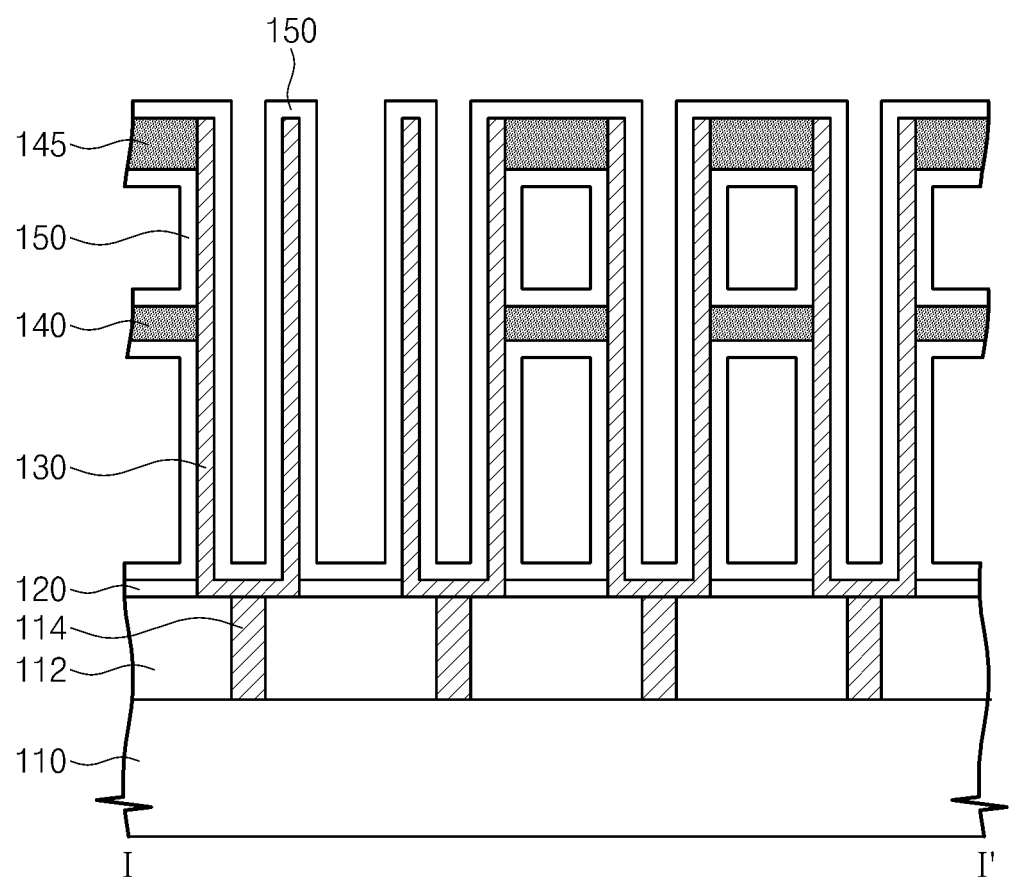

Referring to FIG. 9, a dielectric layer 150 may be formed to cover the exposed lower electrodes 130. The dielectric layer 150 may be conformally formed along surfaces of the lower electrodes 130, surfaces of the lower and upper support patterns 140 and 145, and the top surface of the etch stop layer 120. For example, the dielectric layer 150 may be formed of a single-layer or multi-layer including at least one selected from a group consisting of metal oxides (e.g., $HfO_2$, $ZrO_2$, $Al_2O_3$, $La_2O_3$, $Ta_2O_3$, and $TiO_2$) and perovskite-structural dielectric materials (e.g., $SrTiO_3$(STO), $(Ba,Sr)TiO_3$(BST), $BaTiO_3$, PZT, and PLZT). The dielectric layer 150 may have a thickness of, for example, about 5 nm to about 15 nm (e.g., 5 nm, 15 nm, or some rate therebetween, or in some cases slightly less than 5 nm or slightly more than 15 nm). The dielectric layer 150 may be formed, for example, using a PVD process or an atomic layer deposition (ALD) process.

Referring again to FIG. 1B, an upper electrode 160 may be formed to cover the dielectric layer 150. The upper electrode 160 may include a conductive material. For example, the upper electrode 160 may include at least one of a semiconductor material doped with dopants (e.g., doped poly-crystalline silicon), a conductive metal nitride (e.g., titanium nitride, tantalum nitride, or tungsten nitride), a metal (e.g., ruthenium, iridium, titanium, or tantalum), or a conductive metal oxide (e.g., iridium oxide). The upper electrode 160 may be formed using a PVD process or an ALD process.

The lower electrodes 130, the dielectric layer 150, and the upper electrode 160 may constitute capacitors, and the capacitance of each of the capacitors may be proportional to the area of the dielectric layer 150 disposed between the upper electrode 160 and each of the lower electrodes 130.

In the method for manufacturing the semiconductor device in accordance with embodiments of the inventive concepts, the bowing prevention layer BPL may be formed between the upper support layer 147 and the upper mold layer UMD. During the dry etching process, the etch rate of the bowing prevention layer BPL may be substantially equal to that of the upper support layer 147 but may be lower than that of the upper and lower mold layers UMD and LMD. Thus, the bowing prevention layer BPL may inhibit or reduce the bowing phenomenon from occurring during the dry etching process of forming the storage node holes SNH.

In addition, the etch rate of the bowing prevention layer BPL may be higher than that of the lower and upper support patterns 140 and 145 during the wet etching process. Thus, the bowing prevention layer BPL may be removed by the subsequent wet etching processes of removing the lower and upper mold layers LMD and UMD. As a result, the capacitance of the capacitor may be increased by a predetermined value corresponding to the thickness TH3 of the bowing prevention layer BPL.

The term "bowing prevention" as used herein refers to prevention or reduction of bowing, denting, bending, or other deterioration or deformation of relevant layers such as upper and lower mold layers. For example, by using a bowing prevention layer as disclosed herein, the total bowing phenomenon occurring in an upper mold layer may be less than the bowing phenomenon that occurs in an upper mold layer when a bowing prevention layer is not used.

Figure 10:
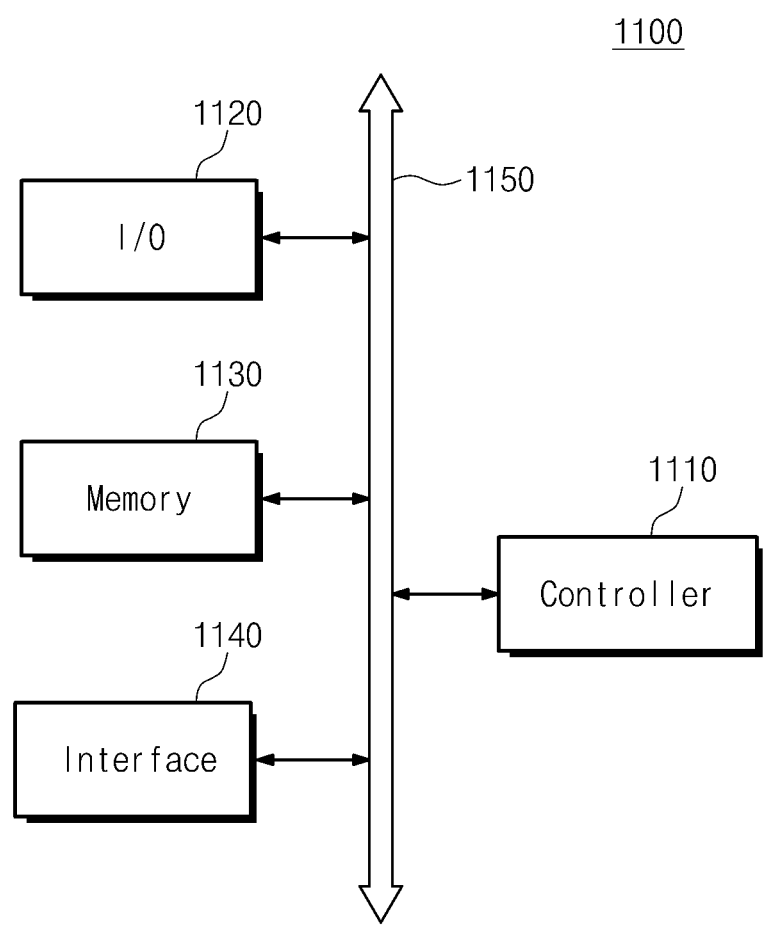
FIG. 10 is a schematic block diagram illustrating an example of a memory system including a semiconductor device according to example embodiments of the inventive concepts.

FIG. 10 is a schematic block diagram illustrating an example of a memory system including a semiconductor device according to example embodiments of the inventive concepts.

As used herein, a semiconductor device may refer for example, to one or more transistors or memory cells, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIG. 10, a memory system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the I/O unit 1120, the memory device 1130 and/or the interface unit 1140 may include the semiconductor device according to the aforementioned embodiment of the inventive concepts.

The controller 1110 may include at least one of a microprocessor, a digital signal processor, a microcontroller or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the memory system 1100 may further include a fast dynamic random access memory (fast DRAM) device and/or a fast static random access memory (fast SRAM) device that acts as a cache memory for improving an operation of the controller 1110.

The memory system 1100 may be applied to an electronic device such as personal digital assistant (PDA), a portable computer, a web tablet, a wireless phone, a mobile phone, a digital music player, a memory card or other electronic products. The other electronic products may receive or transmit information data by wireless.

Figure 11:
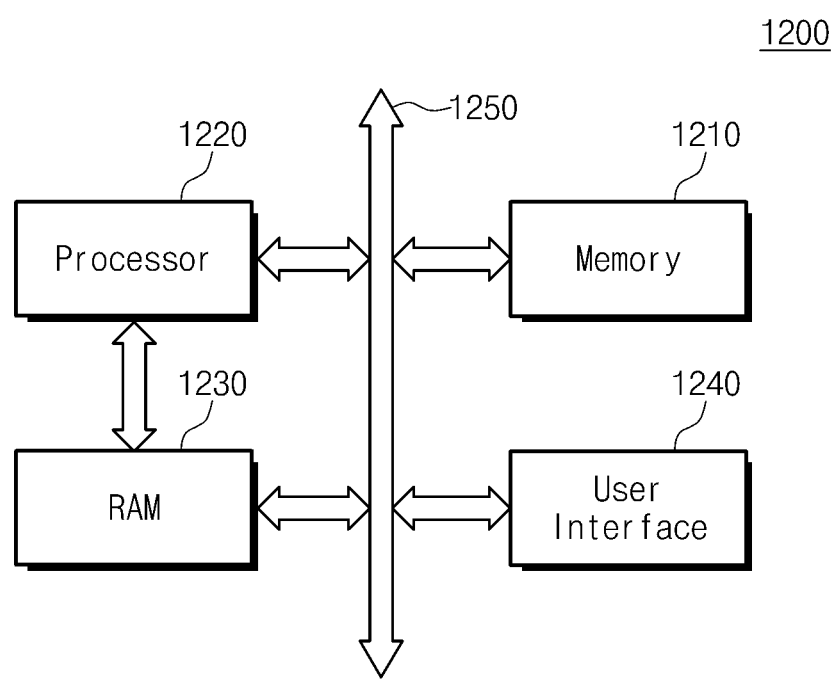
FIG. 11 is a schematic block diagram illustrating an example of an electronic system including a semiconductor device according to example embodiments of the inventive concepts.

FIG. 11 is a schematic block diagram illustrating an example of an electronic system including a semiconductor device according to example embodiments of the inventive concepts.

Referring to FIG. 11, an electronic system 1200 may include at least one of the semiconductor devices according to the above-mentioned embodiments of the inventive concepts. The electronic system 1200 may be an electronic device such as a mobile device or a computer. For example, the electronic system 1200 may include a memory system 1210, a processor 1220, a RAM 1230, and a user interface unit 1240. The memory system 1210, the processor 1220, the RAM 1230, and the user interface unit 1240 may communicate with each other through a system bus 1250. The processor 1220 may execute programs and may control the electronic system 1200. The RAM 1230 may be used as a working memory of the processor 1220. For example, each of the processor 1220 and the RAM 1230 may include the semiconductor device according to the aforementioned embodiments of the inventive concepts. Alternatively, the processor 1220 and the RAM 1230 may be included in one package. The user interface unit 1240 may be used to input or output data into or from the electronic system 1200. The memory system 1210 may store code data for operations of the processor 1220, data processed by the processor 1220, and/or data inputted from an external system.

The electronic system 1200 may be realized as a mobile system, a personal computer, an industrial computer, or another logic system performing various functions. For example, the mobile system may be a personal digital assistant (PDA), a laptop computer, a portable computer, a web tablet, a wireless phone, a mobile phone, a digital music player, or a memory card, or a data transmitting/receiving system. When the electronic system 1200 performs wireless communication, the electronic system 1200 may be used in a communication interface protocol such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

In a method for manufacturing the semiconductor device in accordance with embodiments of the inventive concepts, the bowing prevention layer may be formed between the upper support layer and the upper mold layer. During the dry etching process, the etch rate of the bowing prevention layer may be substantially equal to that of the upper support layer but may be lower than that of the upper and lower mold layers. Thus, in the dry etching process used to form the storage node hole penetrating the upper support layer, the bowing prevention layer, the upper mold layer, the lower support layer and the lower mold layer, the bowing prevention layer may inhibit the bowing phenomenon that may dent the inner sidewall of the storage node hole.

In addition, during the wet etching process, the etch rate of the bowing prevention layer may be higher than that of the lower and upper support layers, and the bowing prevention layer may be removed by the wet etching processes of removing the lower and upper mold layers. As a result, the capacitance of the capacitor may be increased by the value corresponding to the thickness of the bowing prevention layer.

While various aspects of the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device, the method comprising:
   sequentially forming an upper mold layer, a bowing prevention layer, and an upper support layer on a substrate;
   forming a storage node hole using a dry etching process, the storage node hole passing through the upper support layer, the bowing prevention layer and the upper mold layer;
   forming a lower electrode in the storage node hole;
   patterning the upper support layer and the bowing prevention layer to expose a portion of the upper mold layer;
   removing the upper mold layer and at least a portion of the bowing prevention layer using a first wet etching process; and
   sequentially forming a dielectric layer and an upper electrode that cover the lower electrode,
   wherein a first etch rate of the bowing prevention layer is substantially equal to a first etch rate of the upper support layer during the dry etching process, wherein a second etch rate of the bowing prevention layer is higher than a second etch rate of the upper support layer during the first wet etching process, and wherein the upper support layer and bowing prevention layer each have a substantially uniform thickness, and a sum of a thickness of the upper support layer and a thickness of the bowing prevention layer has a value within a range from 15% to 25% of a depth of the storage node hole.

2. The method of claim 1, wherein the upper support layer has a substantially uniform thickness, and the thickness of the upper support layer has a value with the range from 7% to 14% of the depth of the storage node hole.

3. The method of claim 1, wherein the second etch rate of the bowing prevention layer is a rate within a range from 20 times to 500 times the second etch rate of the upper support layer during the first wet etching process.

4. The method of claim 3, wherein the second etch rate of the bowing prevention layer is a rate within a range from 50 nm/min to 500 nm/min during the first wet etching process.

5. The method of claim 3, wherein the second etch rate of the upper support layer is a rate within a range from 1 nm/min to 2.5 nm/min during the first wet etching process.

6. The method of claim 3, wherein an etch rate of the upper mold layer is a rate within a range from the same as to up to 20 times the second etch rate of the bowing prevention layer during the first wet etching process.

7. The method of claim 1, wherein the bowing prevention layer is formed of a different material from that of the upper support layer, and includes $Si_{(1-x)}N_x$, where $0.51<x<0.55$.

8. The method of claim 1, wherein the lower electrode forms a capacitor that is part of a memory cell including at least one transistor formed in part by a doped region in the substrate.

9. The method of claim 7, wherein the upper support layer includes silicon carbonitride (SiCN).

10. The method of claim 1, further comprising:
sequentially forming a lower mold layer and a lower support layer on the substrate before forming the upper mold layer,
wherein the storage node hole passes through the upper support layer, the bowing prevention layer, the upper mold layer, the lower support layer, and the lower mold layer.

11. The method of claim 10, further comprising:
patterning the lower support layer to expose a portion of the lower mold layer; and
removing the lower mold layer using a second wet etching process before forming the dielectric layer,
wherein a portion of the bowing prevention layer remains after the first wet etching process, and
wherein the portion of the bowing prevention layer remaining after the first wet etching process is removed by the second wet etching process.

12. A method for manufacturing a semiconductor device, the method comprising:
sequentially forming an upper mold layer, a bowing prevention layer, and an upper support layer on a substrate;
forming a storage node hole passing through the upper support layer, the bowing prevention layer, and the upper mold layer;
forming a lower electrode in the storage node hole;
patterning the upper support layer and the bowing prevention layer to expose a portion of the upper mold layer;

removing the upper mold layer and at least a portion of the bowing prevention layer; and
sequentially forming a dielectric layer and an upper electrode that cover the lower electrode,
wherein the bowing prevention layer includes $Si_{(1-x)}N_x$, where $0.51<x<0.55$, and
wherein the upper support layer includes silicon carbonitride (SiCN).

13. The method of claim 12, wherein forming the storage node hole comprises: performing a dry etching process, and
wherein a first etch rate of the bowing prevention layer is substantially equal to a first etch rate of the upper support layer during the dry etching process.

14. The method of claim 12, wherein removing the upper mold layer and the at least a portion of the bowing prevention layer comprises: performing a wet etching process, and
wherein a second etch rate of the bowing prevention layer ranges from 20 times to 500 times a second etch rate of the upper support layer during the wet etching process.

15. The method of claim 14, wherein an etch rate of the upper mold layer is a rate within a range from the same as to up to 20 times the second etch rate of the bowing prevention layer during the wet etching process.

16. The method of claim 12, wherein the lower electrode forms a capacitor that is part of a memory cell including at least one transistor formed in part by a doped region in the substrate.

17. A method for manufacturing a semiconductor device, the method comprising:
providing a semiconductor substrate, the semiconductor substrate including doped regions for forming transistors;
forming a first insulating layer on the semiconductor substrate;
forming a plurality of contact plugs extending vertically from a top surface of the first insulating layer to respective doped regions on the semiconductor substrate;
sequentially forming a first mold layer, a first support layer, a second mold layer, a second support supplemental layer, and a second support layer on the first insulating layer;
forming a plurality of storage node holes passing through the second support layer, the second support supplemental layer, the second mold layer, the first support layer, and the first mold layer using a dry etching process;
forming a plurality of lower electrodes in corresponding each of the plurality of storage node holes;
removing the second mold layer and at least portion of the second support supplemental layer using a first wet etching process;
removing the first mold layer using a second wet etching process; and
sequentially forming a dielectric layer and an upper electrode that cover the plurality of lower electrodes,
wherein each of the plurality of storage node holes is formed over the first insulating layer and a corresponding contact plug of the plurality of contact plugs.

18. The method of claim 17, wherein a first etch rate of the second support supplemental layer is a rate within a range from 50 nm/min to 500 nm/min during the first wet etching process, and
wherein a first etch rate of the second support layer is a rate within a range from 1 nm/min to 2.5 nm/min during the first wet etching process.

19. The method of claim 17, wherein an etch rate of the second support supplemental layer is substantially equal to an etch rate of the second support layer during the dry etching process, and
  wherein an etch rate of the second support supplemental layer is lower than an etch rate of the first mold layer and lower than an etch rate of the second mold layer during the dry etching process.

20. The method of claim 17, wherein the second support supplemental layer is a deformation prevention layer that includes $Si_{(1-x)}N_x$, where $0.51<x<0.55$, and
  wherein the second support layer includes silicon carbonitride (SiCN).

* * * * *